US008659104B2

(12) United States Patent
    Curatola et al.

(10) Patent No.: US 8,659,104 B2
(45) Date of Patent: Feb. 25, 2014

(54) FIELD-EFFECT MAGNETIC SENSOR

(75) Inventors: Gilberto Curatola, Korbek-lo (BE);
    Victor Zieren, Valkenswaard (NL);
    Anco Heringa, Waalre (NL)

(73) Assignee: NXP B.V., Eindhoven (NL)

( * ) Notice: Subject to any disclaimer, the term of this patent is extended or adjusted under 35 U.S.C. 154(b) by 244 days.

(21) Appl. No.: 12/974,861

(22) Filed: Dec. 21, 2010

(65) Prior Publication Data
    US 2012/0154019 A1    Jun. 21, 2012

(51) Int. Cl.
    *H01L 29/82*    (2006.01)
(52) U.S. Cl.
    USPC ........... 257/427; 257/241; 257/252; 257/141; 257/E29.323; 257/E21.382
(58) Field of Classification Search
    USPC .......... 257/427, 252, E29.323, E21.382, 141, 257/368, 347, 241, 266, 287, 421
    See application file for complete search history.

(56) References Cited

U.S. PATENT DOCUMENTS

| | | | |
|---|---|---|---|
| 5,757,055 A | 5/1998 | Kalb, Jr. et al. | |
| 5,801,533 A | 9/1998 | Kalb, Jr. | |
| 2002/0186584 A1 | 12/2002 | McDowell et al. | |
| 2005/0121700 A1 | 6/2005 | Li et al. | |
| 2006/0097715 A1 | 5/2006 | Oohira et al. | |
| 2008/0239930 A1 | 10/2008 | Saito et al. | |
| 2009/0218621 A1* | 9/2009 | Pfirsch et al. | 257/342 |
| 2009/0224327 A1* | 9/2009 | Liou et al. | 257/368 |
| 2010/0032713 A1* | 2/2010 | Kawahara et al. | 257/141 |
| 2010/0308830 A1 | 12/2010 | Shankar et al. | |

OTHER PUBLICATIONS

Extended European Search Report, EPO, Munich, Mar. 22, 2012.

* cited by examiner

*Primary Examiner* — Cathy N Lam (57) ABSTRACT

A field-effect magnetic sensor facilitates highly-sensitive magnetic field detection. In accordance with one or more example embodiments, current flow respectively between first and second source/drain terminals and a third source/drain terminal is controlled using inversion layers in separate channel regions for each of the first and second terminals. In response to a magnetic field, a greater amount of current is passed between the third source/drain terminal and one of the first and second source/drain terminals, relative to an amount of current passed between the third source/drain terminal and the other one of the first and second source/drain terminals.

21 Claims, 6 Drawing Sheets

FIELD-EFFECT MAGNETIC SENSOR

Various aspects of the present invention are directed to magnetic sensors, and more particularly to field-effect magnetic sensors.

Magnetic sensors are increasingly important in various applications and industries. For example, magnetic sensors are often implemented in automotive applications. Brushless-DC motors, angular sensors (e.g., combined with magnetoresistive sensors for 360 degree sensing), current sensors, engine and transmission sensors, magnetic parking sensors, ABS (Anti-lock Braking System) sensors and tire pressure sensors are used extensively in modern vehicles. Magnetic sensors have been used in these and other applications for improving comfort and safety. Magnetic sensors are particularly useful in automotive applications, because magnetic fields penetrate easily through most materials. Magnetic sensors are also highly insensitive to dirt and other conditions that may be challenging, for example, to the proper operation of optical sensors.

Sensors that detect magnetic field strength and/or magnetic field direction are based on a variety of different physical mechanisms and technologies. Selecting a type of sensor may depend, for example, upon a detectable magnetic field range and application area for a particular implementation in which the sensor is to be used, in which dimensions, construction, technology and power consumption are additional selection criteria. For example, some sensors employ bipolar transistors and field effect transistors, which can be fabricated in conventional industrial integrated circuit (IC) processes.

While useful in these and other applications and industries, many magnetic sensors are relatively insensitive for detecting small magnetic fields or small variations in magnetic fields. Such characteristics can limit the application of magnetic sensors.

Various example embodiments are directed to field-effect magnetic sensors for a variety of devices and applications, including those discussed above.

In connection with an example embodiment, a field-effect magnetic sensor includes first and second source/drain terminals in a substrate, a third source/drain terminal in the substrate and channel regions between the first and second source/drain terminals, with the channel regions separated by a drift region. In an unbiased state, the channel regions inhibit current flow between each of the first and second source/drain terminals and the third source/drain terminal, via the drift region. A gate (or separate gates) adjacent the channel regions biases the channel regions to cause the channel regions to permit current flow between the third source/drain terminal and each of the first and second source/drain terminals, via the drift region. The sensor is responsive to a magnetic field to, when in a biased state, pass a greater amount of current between the third source/drain terminal and one of the first and second source/drain terminals, relative to an amount of current passed between the third source/drain terminal and the other one of the first and second source/drain terminals.

Another example embodiment is directed to a magnetic sensor having two n+ terminals, each terminal including an n+ doped region in a semiconductor substrate, and an n-well electron reservoir terminal in the substrate. Two p-well regions are located between the n+ terminals and the n-well electron reservoir terminal, each p-well region inhibiting current flow between the n-well electron reservoir and the n+ terminals. For each p-well region, a p+ well contact is located at an upper surface of the substrate and connected to the p-well region. A lightly n-doped material is in the substrate and extends between the p-well regions. A gate oxide is on the substrate and over the lightly n-doped material and an upper channel region of each of the p-well regions, and a gate electrode is over the gate oxide and the channel regions. The gate electrode is configured to control the charge density at the channel regions in response to a voltage applied to the gate electrode, to create an inversion layer in the channel regions to flow current between the n-well electron reservoir terminal and the n+ terminals, through a portion of the lightly n-doped material between the channel regions.

Another example embodiment is directed to a method for operating a field-effect magnetic sensor having first, second and third source/drain terminals in a semiconductor substrate. In an on state, channel regions immediately adjacent the first and second source/drain regions are biased to create an inversion layer in the channel regions, and to pass current between each of the first and second source/drain regions and a drift region between the channel regions, and further with the third source/drain terminal via the drift region. The current flow is responsive to a magnetic field to pass a greater amount of current between the third source/drain terminal and one of the first and second source/drain terminals, relative to an amount of current passed between the third source/drain terminal and the other one of the first and second source/drain terminals. In an off state, the channel regions are used to mitigate current flow between the third source/drain terminal and each of the first and second source/drain regions. In some implementations, the first and second terminals are selectively biased, relative to the third terminal, to control the direction of current flow between the third terminal and each of the first and second terminals.

The above discussion is not intended to describe each embodiment or every implementation of the present disclosure. The figures and following description also exemplify various embodiments.

Various example embodiments may be more completely understood in consideration of the following detailed description in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims. Furthermore, the term "example" as used throughout this document is by way of illustration, and not limitation.

The present invention is believed to be applicable to a variety of different types of magnetic sensors and related devices and systems for use with sensors. While the present invention is not necessarily so limited, various aspects of the invention may be appreciated through a discussion of examples using this context.

According to an example embodiment, a field effect magnetic sensor includes two corresponding terminals and a third terminal, and passes current between the third terminal and each of the corresponding terminals via channel regions for each corresponding terminal. The channel regions are located between the corresponding terminals and pass current with (e.g., to and/or from) the corresponding terminals in response to a bias presented thereto by a gate. The channel regions are also separated by a drift-type region, which generally passes current independently from the gate and any bias applied thereby. The sensor limits current flow with the respective corresponding terminals to the biased channel region.

In the absence of a magnetic field, current flowing between the third terminal and each of the corresponding terminals via the biased channel regions is about equal. In the presence of a magnetic field, current flowing via the biased channel regions between the third terminal and one of the corresponding terminals is greater than current flowing between the third terminal and the other one of the corresponding terminals. This differential current can be sensed (e.g., via contacts to the corresponding terminals) and used to detect the presence of the magnetic field.

In some implementations, the corresponding terminals are drain terminals and the third terminal is a source terminal. In other implementations, the corresponding terminals are source terminals and the third terminal is a drain terminal. In either instance, current flow via the biased channel regions is affected differently for each of the corresponding terminals in the presence of a magnetic field. In addition, by controlling the application of the bias (e.g., via a gate electrode capacitively coupled to the channel), the sensitivity of the field effect magnetic sensor can be tuned on an application-by-application basis.

The third terminal as discussed above can be implemented in one or more of a variety of manners. In certain embodiments, the third terminal is a buried terminal in a semiconductor substrate, which can be implemented as an electron source (e.g., as a deep n-well). In other embodiments, the third terminal is split between two or more terminals that are connected or otherwise configured to present a combined and about equal current to each of the corresponding terminals when a magnetic field is not present.

In some embodiments, the sensor includes well regions that separate the corresponding terminals from the third terminal and a drift region between the channels in an unbiased state, with a portion of the well region for each terminal delimited by the drift region and corresponding first or second terminal forming the channel region. When the well region between the drift region and the corresponding terminals is biased, it operates to effect an inversion region that passes current between the drift region and the corresponding terminals, with the drift region also being electrically coupled to the third terminal.

In other embodiments, the drift region has a polarity that is the same as the corresponding terminals, and doped well regions of a polarity that is opposite the polarity of the corresponding terminals. The well regions separate the drift region from the corresponding terminals and, when in an unbiased state, mitigate or prevent current flow between the third terminal and the corresponding terminals via the drift region. When the well regions in the channel are biased (via the gate), an inversion layer is formed between the drift region and the corresponding terminals to flow current.

Various embodiments are directed to a sensor as discussed above, with the inversion layer and, where appropriate, the channel regions themselves being limited in size to limit an amount of current flowing between the corresponding regions and the third terminal. In some instances, the inversion layer is controlled by one or more gate electrodes capacitively coupled to the channels via a dielectric material between the channel and the gate (e.g., to form a thin inversion layer of a thickness that is less than about 100 nm, or less than about 20 nm). In other instances, a doped region such as the above-discussed doped well region is used to limit the size of the channel region and the amount of current that flows therein. In still other instances, the gate and channel regions are configured and/or operated to produce an inversion layer that limits current flow to/from the corresponding regions to a limited value.

In certain embodiments, the physical arrangement of each of the channels is set to limit the inversion region. For example, the channel region may be formed in a narrow trench, or formed in a fin type region of a finFET type of device with the channel extending over a substrate. In such applications, the application of a bias to the channel region can be limited to a portion of the channel (e.g., an upper portion of a fin region) to limit the width of the inversion layer formed in the channel, in response to a bias applied thereto.

Figure 1:
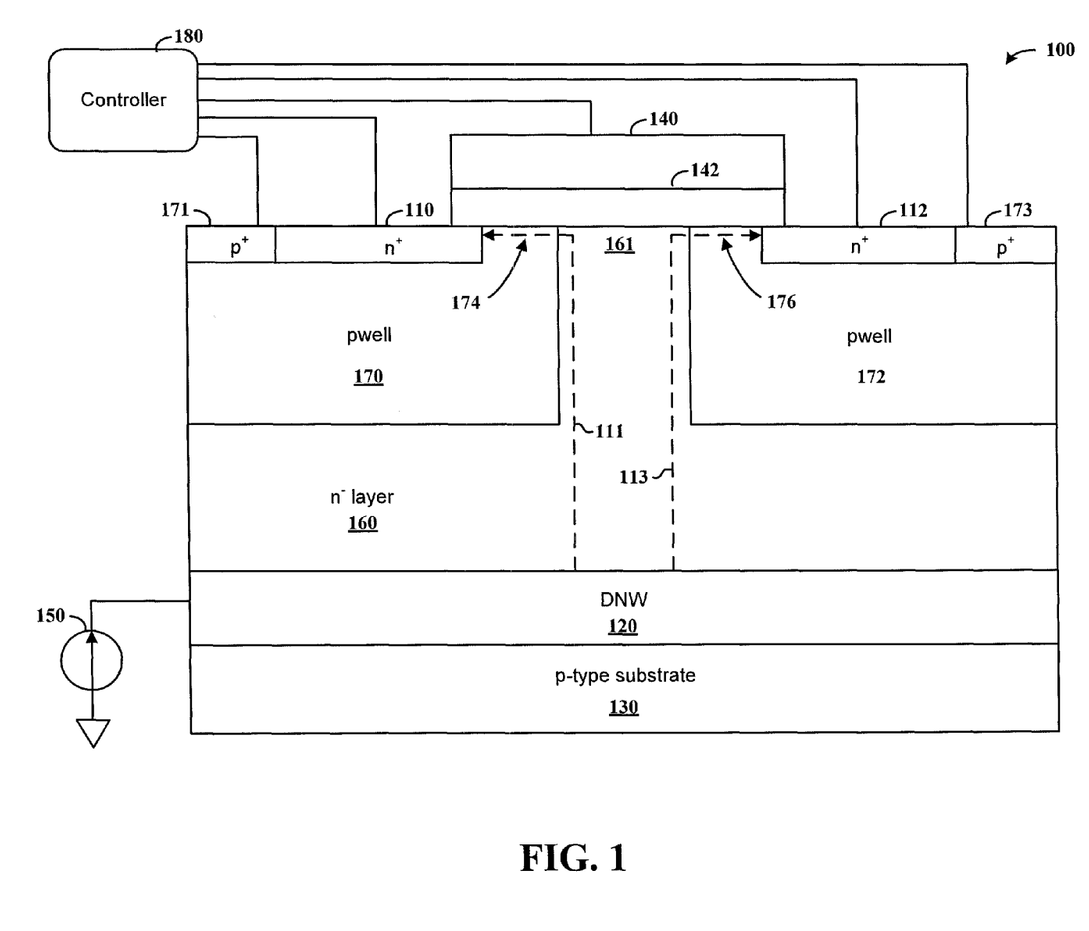
FIG. 1 shows a field effect magnetic sensor, according to an example embodiment of the present invention.

Turning now to the figures, FIG. 1 shows a cross-section of a field effect magnetic sensor 100, according to another example embodiment of the present invention. The sensor 100 includes first and second terminals 110 and 112, and a third terminal 120 in a substrate 130 below the first and second terminals in a vertical arrangement. A gate 140 is over gate dielectric material 142 that separates the gate from channel regions 174 and 176 and a drift region 161. In addition, while shown as a contiguous gate extending over both channel regions 174 and 176, the gate 140 may be separated into separate components over the respective channel region (e.g., as a bias need not necessarily be provided to drift region 161, discussed further below, between the channels).

Well regions 170 and 172 are located below and adjacent the first and second terminals 110 and 112, inhibit current flow respectively between terminals 110 and 120, and between terminals 112 and 120. Highly-doped contact regions 171 and 173, respectively for well regions 170 and 172, are configured to fix the potential of the well regions according to a potential applied to the contact regions. An upper portion of the well regions 170 and 172 respectively form the channel regions 174 and 176, which inhibit current flow as above in an unbiased state.

The gate 140 biases a portion of the channel regions 174/176 adjacent the gate dielectric material 142, to facilitate current flow respectively between terminal 110 and 120 and between terminal 112 and 120, as represented by dashed lines 111 and 113. The current flow is dependent upon the applied voltage (e.g., whether voltage at terminal 120 is higher or lower than voltage at terminals 110 and 112). The bias creates an inversion layer in upper channel regions 174 and 176 of the well regions 170 and 172, respectively. For example, the gate 140 can apply a bias to control the charge density at an oxide/silicon interface between the dielectric material 142 and the channel regions 174/176, in a manner similar to that in a field effect transistor. The current flows through a donor region 160 and a drift portion 161 of region 160 adjacent the channel regions 174/176, and the aforesaid inversion layer in well regions 170 and 172, in the channel and adjacent the gate dielectric 142.

The amount of bias applied to the gate 140 can be set to control the size of the inversion layer in each channel region 174/176 and, correspondingly, an amount of current flow in the sensor 100. In some implementations, the sensor 100 further includes a controller 180 that controls and/or applies the bias to the gate 140. The controller 180 may, for example, also be coupled to apply a potential to the respective contacts 171 and 173, and may further be coupled to the terminals 110 and 112 for reading an output therefrom.

The sensor 100 is shown having regions of polarity as shown by way of example, and may be implemented with alternate regions (e.g., alternating p-type and n-type regions for different carrier types). In such applications, current flow between terminals 110 and 120 and between terminals 112 and 120, may be in a direction that is opposite that as shown via the dashed lines 111 and 113. Moreover, certain embodiments are implemented with fewer than all of the components shown, or with additional components, such as those embodiments described above prior to the description of FIG. 1, or described elsewhere herein (e.g., in the claims).

In accordance with an embodiment in which terminals 110 and 112 are highly n+ doped and operate as drain terminals, and in which terminal 120 is a deep n-well region operating as a current source terminal (as reservoir for electrons), the sensor 100 operates as follows. The substrate 130 is a p-type substrate, and current flows between the deep n-well region 120 and the drift region 161 through a lightly doped n⁻ donor layer 160. The well regions 170 and 172 are p-well regions that mitigate or prevent electron current from reaching the terminals 110 and 112 in an unbiased state, and further limit such electron current to a small inversion layer (e.g., 10-30 nm thick) in the channel regions 174 and 176 (when biased) near the gate dielectric 142. The contacts 171 and 173 are heavily-doped p+ regions that respectively form contacts to the well regions 170 and 172 for fixing (setting) the potential of the well regions.

In the absence of a magnetic field, the total current injected from the source 120 splits about equally between the two drain terminals 110 and 112, and a differential read-out of the output current at the drain terminals 110 and 112 (e.g., via controller 180) will not reveal any signal. The channel regions 174 and 176 are delimited by the gate oxide 142, the terminals 110 or 112 and n-drift region 161 of the lightly doped n⁻ donor layer 160. These channel regions 174/176 are depleted of electrons and cannot carry any current. In this condition, the overall transistor formed by the drain terminals 110/112, the source terminal 120 and gate 140 is in off-state condition, and no current is detected at the two drain terminals.

When a sufficient voltage is applied to the gate 140, the left and right channel regions 174 and 176 become inverted and connect the lightly doped drift region 161 to the n+ drain terminals 110 and 112. In this condition, the transistor is in an on-state condition and a current can be observed at the respective drain terminals. The total on-current depends on the device geometry (e.g., channel length, drain-to-drain distance) and on the doping profile.

In the presence of a magnetic field and when the transistor is in an on state, carriers experience a Lorentz force which causes a deflection of the carrier flux towards one of the two drain terminals 110 and 112, with the direction of the magnetic field being orthogonal to the carrier flux (e.g., a magnetic field perpendicular to the drawing plane in FIG. 1). This deflection of the current flux towards one of the two drain terminals 110 and 112 causes a detectable current displacement between the drain terminals. The currents and their displacement may be negligible when the transistor is in off-state condition, and increases when the transistor is in on-state condition, allowing the sensor to be switched on and off via the voltage applied to the gate electrode. By sensing the difference between the current at the two drain terminals 110 and 112, a value of the magnetic field strength can be detected (e.g., as corresponding to the difference of currents 111 and 113).

The sensitivity of the sensor 110 is related to the current displacement, to the magnetic field and to the overall current that drives the field effect transistors. More precisely, the sensor sensitivity is given by:

$$S = \frac{\Delta I_D}{I_S \cdot B}, \quad \text{(Equation 1)}$$

where $\Delta I_D$ represents the current displacement at the drain terminals 110 and 112 (111-113), $I_S$ represents the input source current, and B represents the flux density of the applied magnetic field. In some implementations, the controller 180 is programmed or otherwise configured to carry out a calculation to output a value corresponding to the sensor sensitivity represented by Equation 1 above. In these and other contexts as discussed herein, the controller 180 may be implemented using a logic circuit such as a computer processor or other logic circuit as described herein.

The sensor 100 is configured for operation with a positive voltage applied at the top n+ contacts (terminals 110, 112), or with a positive voltage applied to terminal 120 as discussed herein, to effectively interchange the source/drain function between the terminals and thus the direction of the electron current as shown via 111, 113. Accordingly, in some embodiments, terminal 120 is a deep n-well used as a source, a current or voltage source 150 is optionally coupled to between the deep n-well 120 layer and a GND terminal. In other embodiments, the terminals 110/112 are connected to a positive voltage via a set of current measuring components, such that the current is directed from terminals 110/112 to the terminal 120. The terminal 120 can also be implemented as a deep n-well drain, in which a current source is connected between a positive supply or bias voltage and the drain, and the (source) terminals 110/112 via a set of current measuring components to a GND terminal such that the current is directed from the drain (120) to the sources (110/112). These approaches can be carried out to facilitate a desirable off-set correction. In some implementations, the controller 180 is configured to control the application of voltage bias and/or current supply to the terminals 110/112 and 120 as discussed above.

The width of the portion of region 160 in which charge carriers flow vertically, as represented by dashed lines 111 and 113, can be modulated and/or confined. This can be carried out, for example, by applying a voltage or current source of appropriate polarity to the terminal 120. In some implementations, width of the vertical portion of region 160 in which charge carriers flow is controlled by biasing the wells 170 and 172 negatively via contacts 171 and 173, relative to the source (e.g., terminal 120).

While one device is shown, two or more such devices 100 can be implemented in a common sensor arrangement. Each device can be oriented to detect a magnetic field in a desirable direction. For instance, two orthogonal structures can be merged in X- and Y-directions to sense corresponding magnetic fields.

Sensors as described herein may be designed, manufactured and tested in a variety of manners. In some implementations, simulations are carried out with CMOS technologies, with numerically extracted doping profiles used for the simulation of the magnetic sensor. A fine symmetric simulation mesh can be used to avoid asymmetry related to numerical simulations, which would results in an unphysical current displacement at the drain terminals even in absence of an applied magnetic field.

Figure 2:
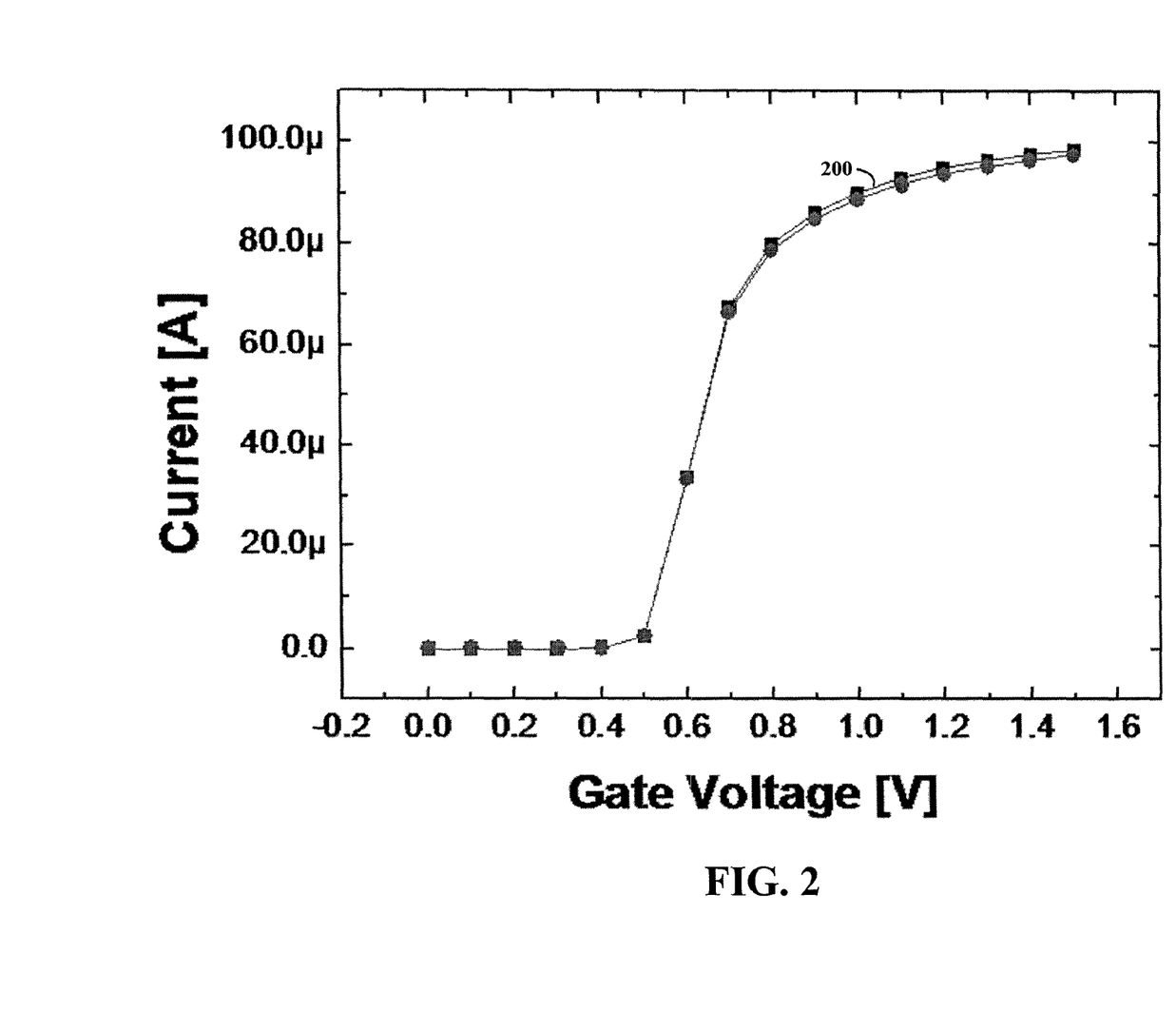
FIG. 2 shows a plot of drain current as a function of applied gate voltage for a field effect magnetic sensor, according to another example embodiment of the present invention.

FIG. 2 shows a plot 200 of drain current as a function of applied gate voltage for a field effect magnetic sensor, according to another example embodiment of the present invention. The plot 200 may, for example, be obtained by applying a magnetic field of 20 mT in the direction parallel to the oxide/semiconductor plane, with a sensor such as the sensor 100 shown in FIG. 1. When the gate voltage is sufficient to invert the well regions at the oxide/silicon interface (e.g., 170, 172 at 174, 176), a non-negligible drain current starts flowing and the effect of the Lorentz force manifests itself with a current displacement at the drain terminals (e.g., 110, 112).

Figure 3:
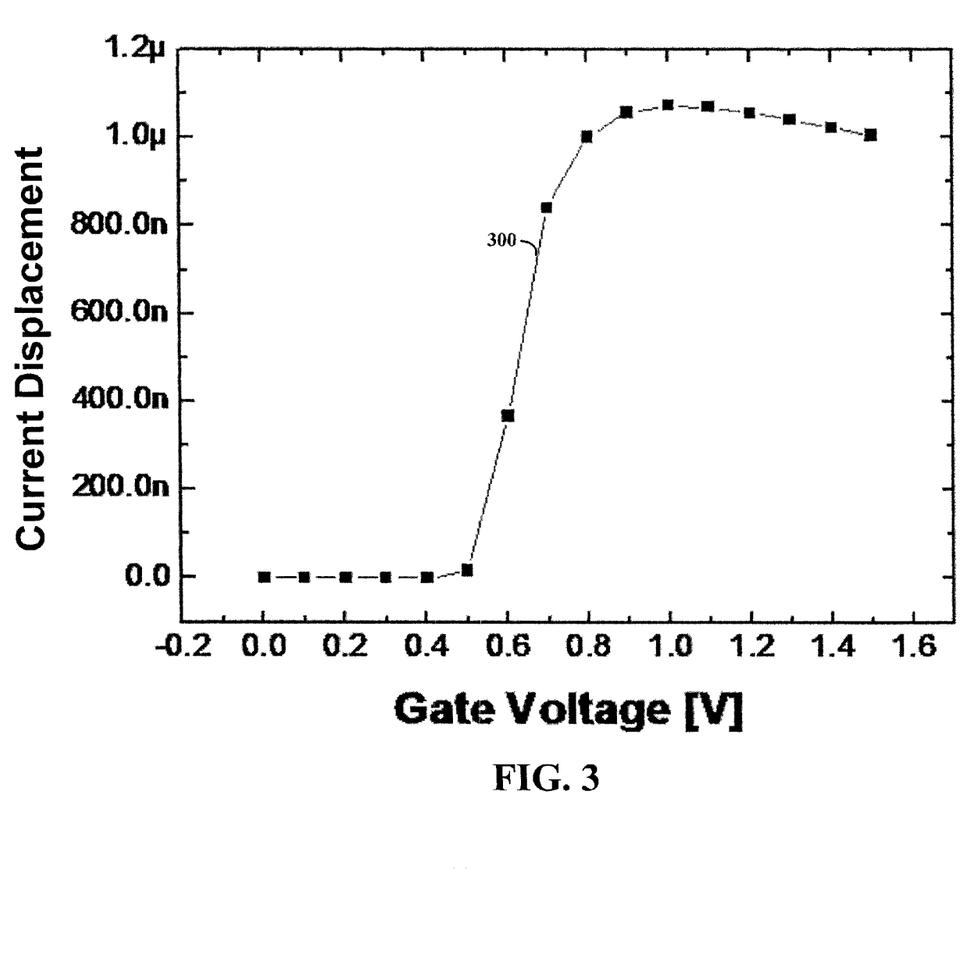
FIG. 3 shows a plot of current displacement between terminals of a field effect magnetic sensor as a function of applied gate voltage for a field effect magnetic sensor, according to another example embodiment of the present invention.

FIG. 3 shows a plot 300 of current displacement between terminals of a field effect magnetic sensor as a function of applied gate voltage for a field effect magnetic sensor, according to another example embodiment of the present invention. The plot 300 may, for example, be obtained using a sensor such as sensor 100 in FIG. 1, with corresponding current displacement.

Figure 4:
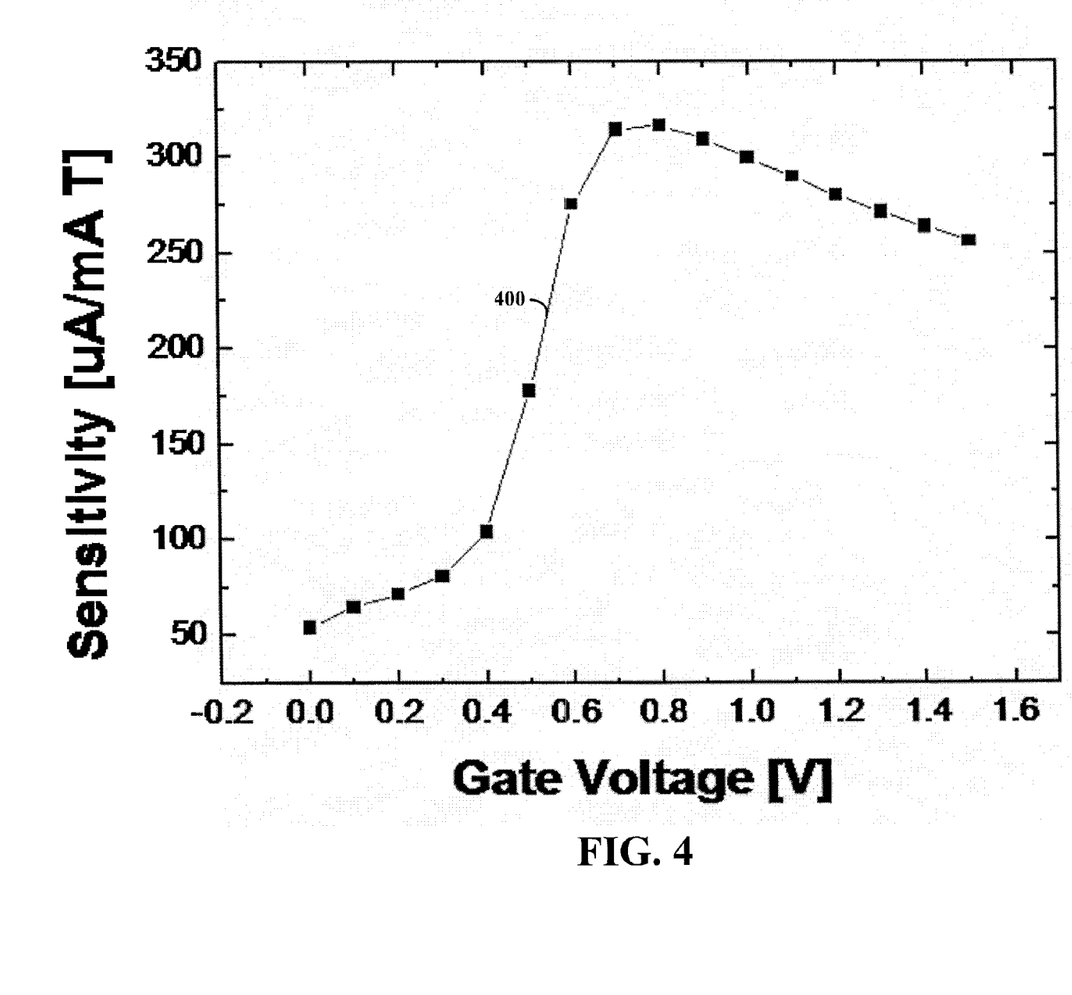
FIG. 4 shows a plot of field effect magnetic sensor sensitivity as a function of applied gate voltage, according to another example embodiment of the present invention.

FIG. 4 shows a plot 400 of field effect magnetic sensor sensitivity as a function of applied gate voltage, according to another example embodiment of the present invention. The sensitivity may, for example, be applied to a sensor such as the sensor 100 shown in FIG. 1, and as described above with a 20 mT magnetic field.

Figure 5:
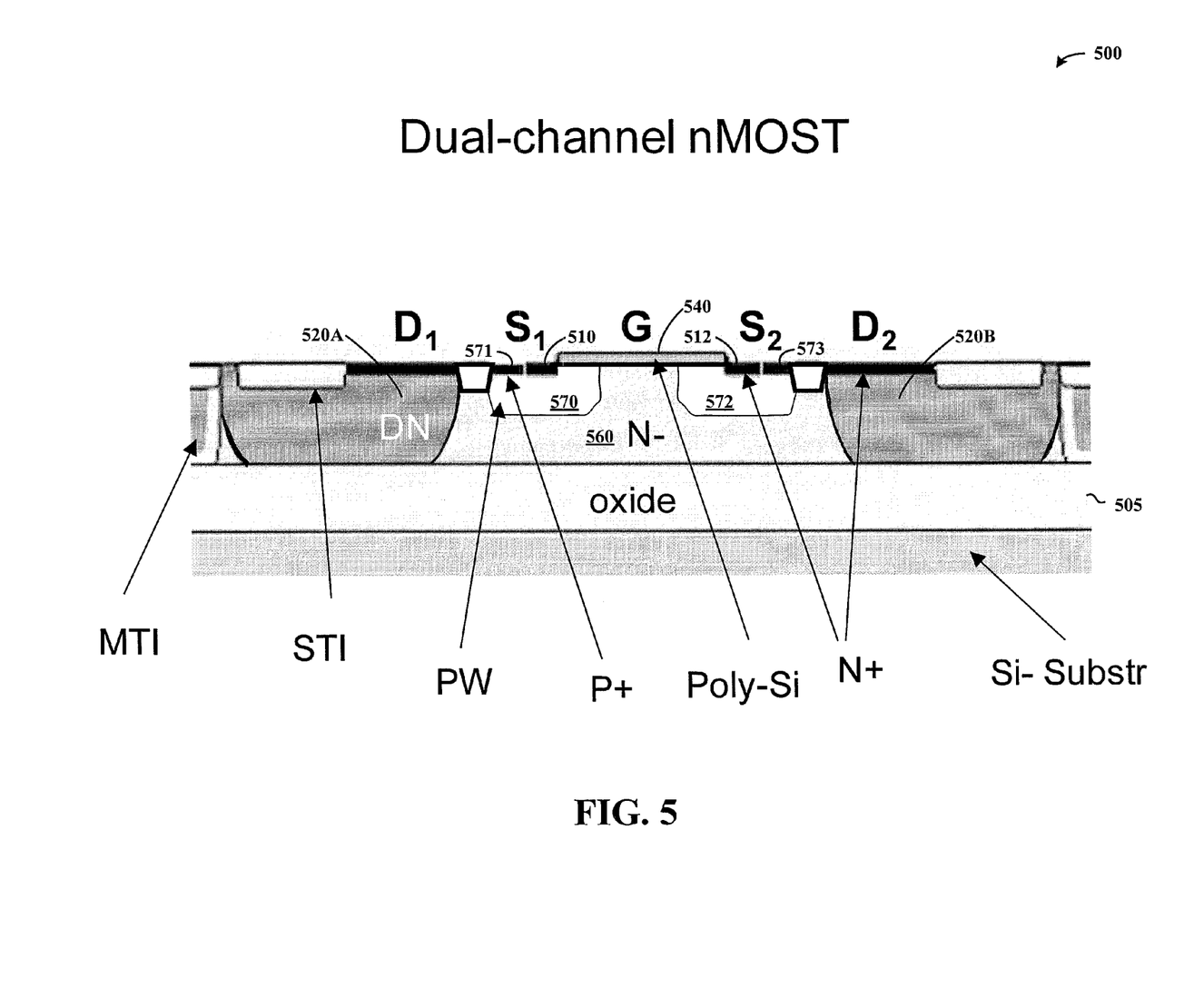
FIG. 5 shows a dual channel NMOS sensor, according to another example embodiment of the present invention.

FIG. 5 shows a dual channel NMOS sensor 500, according to another example embodiment of the present invention. The sensor 500 may, for example, be implemented using one or more approaches as described above, including those described in connection with FIG. 1, for some or all similar components, which are labeled using similar reference numbers by way of example (e.g., 540 and 140 are both gates). The sensor 500 is formed in a silicon-on-insulator (SOI) structure with a silicon region over a buried insulator 505.

The sensor 500 includes source terminals 510 and 512, and split drain terminals 520A and 520B. The source terminals 510/512 are isolated by p-well regions 570/572. A polysilicon gate 540 has an underlying oxide layer and is located over channel regions respectively including an upper portion the p-well regions near the oxide layer. Contacts 571/573 for the p-well regions 570/572 are isolated from adjacent contacts, and are applicable for applying a potential to the p-well regions.

The gate 540 is configured to capacitively couple a bias to these upper portions of the p-well regions 570/572, as delimited by the source terminals 510/512 and an upper drift region of a lightly doped n⁻ donor layer 560. This bias forms an inversion layer in the p-well regions under the gate, and permits current flow between the source terminals 510/512 and the drain terminals 520A/520B, via the donor layer 560. This current flow is responsive to a magnetic field, such that a differential value detected at the drain terminals 520A/520B is about zero in the absence of a magnetic field, and is non-zero in the presence of a magnetic field.

Figure 6:
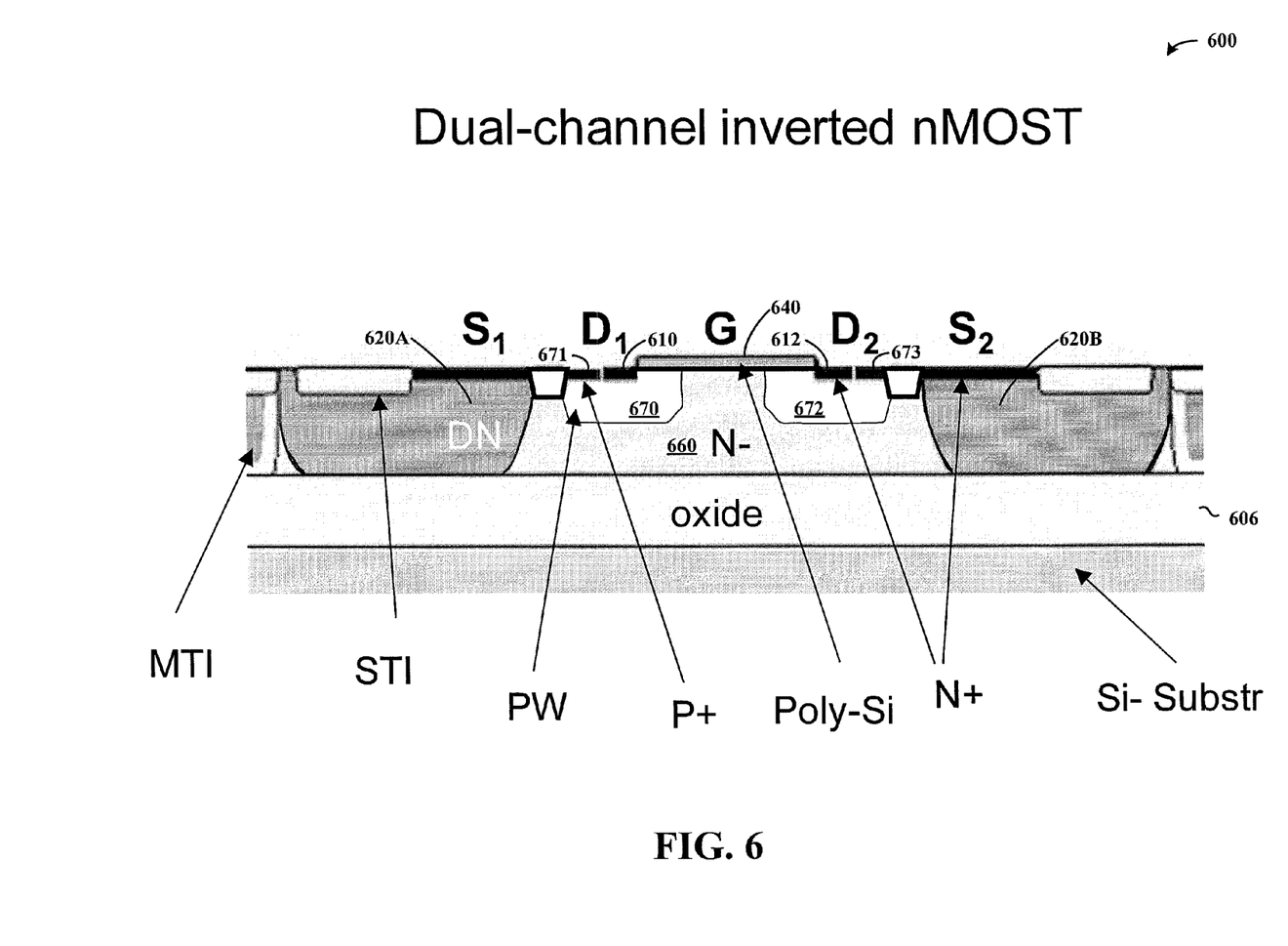
FIG. 6 shows a dual-channel inverted NMOS sensor, according to another example embodiment of the present invention.

FIG. 6 shows a dual-channel inverted NMOS sensor 600, according to another example embodiment of the present invention. The sensor 600 is similar to sensor 500, with the respective source and drain terminals switched in functionality. Specifically, terminals 610 and 612 are drain terminals, and terminals 620A and 620B are source terminals (e.g., relative to source terminals 510/512, and drain terminal 520).

Accordingly, operation of the sensor 600 is similar to that discussed above with FIG. 5, with current flow from the drain(s) to source(s).

The various controllers and control methods described herein can be implemented using a variety of devices and methods. For example, logic or processing circuits can be implemented using one or more of: discrete logic circuitry, fully-programmable and semi-programmable circuits such as PLAs (programmable logic arrays), specialized processors or general purpose processors that are specially programmed. Combinations of these and other circuit components are also possible and within the scope of various embodiments, including those discussed above. For example, the controller 180 in FIG. 1 can be implemented in a variety of circuit-based forms, such as through the use of data processing circuit modules. Such systems are exemplified by implementation in high-speed programmable computer/processor circuits, or in combination with discrete and or semi-programmable circuitry (e.g., as Field-Programmable Gate Arrays, Programmable Logic Devices/Arrays).

Based upon the above discussion and illustrations, those skilled in the art will readily recognize that various modifications and changes may be made to the present invention without strictly following the exemplary embodiments and applications illustrated and described herein. For example, different orientations of source/drain combinations as may be relevant to p-type or n-type substrates with current flow corresponding to hole-based or electron-based dopants. In addition, the vertical sensors as shown in the figures can be implemented in other arrangements, and the order/orientation of sensor components may be altered in shape or composition to achieve a similar function (e.g., relating to the control of a small gate-controlled channel region in which current flows). Such modifications do not depart from the true spirit and scope of the present invention, including that set forth in the following claims.

What is claimed is:
1. A field-effect magnetic sensor comprising:
    first, second and third source/drain terminals in a semiconductor substrate;
    for each of the first and second source/drain terminals, a channel region configured and arranged to, in an unbiased state, inhibit current flow between the each of the first and second source/drain terminals and the third source/drain terminal;
    a drift region in the substrate and separating the respective channel regions;
    a gate configured and arranged to bias the channel regions to create, in the respective channel regions, an inversion layer that flows current between the third source/drain terminal and respective first or second source/drain terminals, via the drift region; and
    the sensor being configured and arranged to respond to a magnetic field to, when the channel region is in a biased state, pass a greater amount of current between the third source/drain terminal and one of the first and second source/drain terminals, relative to an amount of current passed between the third source/drain terminal and the other one of the first and second source/drain terminals, the channel regions being delimited by the drift region and one of the first and second source/drain terminals, and being respectively configured to affect the flow of current between the third source/drain terminal and the first and second source/drain terminals depending on whether the channel regions are in a biased state or an unbiased state.

2. The sensor of claim 1, further including, in the substrate,
a first doped region configured and arranged to restrict the flow of current to or from the first source/drain terminal to current flow between the first source/drain terminal and the drift region via the inversion layer, and
a second doped region configured and arranged to restrict the flow of current to or from the second source/drain terminal to current flow between the first source/drain terminal and the drift region via the inversion layer.

3. The sensor of claim 1, the channel regions being respectively configured to,
when in an unbiased state, inhibit the flow of current between the third source/drain terminal and the first and second source/drain terminals, and
when in a biased state, permit the flow of current between the third source/drain terminal and the first and second source/drain terminals via an inversion region facing the gate.

4. The sensor of claim 3, wherein each of the channel regions is respectively part of a larger well region, each larger well region respectively extending below and around the first and second source/drain terminals to limit current flow with the respective terminals to the channel regions.

5. The sensor of claim 3, wherein
each of the channel regions is respectively part of a larger well region, each larger well region respectively extending below and around the first and second source/drain terminals to limit current flow with the respective terminals to flow via the channel region,
each larger well region is connected to a highly-doped contact region configured to fix the potential of the well region to mitigate the flow of current via the well region, and
the gate biases the channel regions at the fixed potential to create the inversion layers.

6. The sensor of claim 1, wherein the sensor is configured to limit current flow between the third source/drain terminal and either of the first and second source/drain terminals to current flow via an inversion region created in the channel regions by the gate.

7. The sensor of claim 1, wherein the third source/drain terminal includes two contact regions adjacent to and electrically insulated from the first and second source/drain terminals.

8. The sensor of claim 1, wherein
the source/drain terminals and channel regions are formed in a silicon layer on a buried insulator of a silicon-on-insulator substrate,
the third source/drain terminal includes two contact regions adjacent to and electrically insulated from the first and second source/drain terminals, and
the silicon layer is configured to pass current between the third source/drain terminal and each of the first and second source/drain terminals, via the channel regions.

9. The sensor of claim 1, wherein
the source/drain terminals and channel regions are formed in a silicon layer on a buried insulator of a silicon-on-insulator substrate,
the third source/drain terminal includes doped regions extending from an upper surface of the silicon to the buried insulator, and
the silicon layer is configured to pass current between the third source/drain terminal and each of the first and second source/drain terminals, via the channel regions.

10. The sensor of claim 1, wherein
the source/drain terminals and channel regions are formed in a silicon layer on a buried insulator of a silicon-on-insulator substrate,
the third source/drain terminal includes doped regions extending from an upper surface of the silicon to the buried insulator,
the channel regions are respectively part of p-well regions that also extend below the respective first and second source/drain terminals and over a portion of the silicon layer that is between the p-well regions and the buried insulator, and
the silicon layer is configured to pass current between the third source/drain terminal and each of the first and second source/drain terminals through a current path extending below and between the p-well regions and through an inversion layer in the channel regions.

11. The sensor of claim 1, wherein the first and second source/drain terminals are drain regions and the third source/drain terminal is a source region.

12. The sensor of claim 1, wherein the first and second source/drain terminals are source regions and the third source/drain terminal is a drain region.

13. The sensor of claim 1, wherein
the sensor is configured to flow current between the third source/drain terminal and each of the first and second source/drain terminals by flowing current through a portion of the drift region extending between the channel regions, and
one of the terminals being configured and arranged to, in response to a bias applied thereto, modulate the width of a portion of the drift region via which the current flows.

14. The sensor of claim 1, further including a controller configured to apply a voltage to the gate to control the gate to bias the channel regions to create the inversion layers.

15. The sensor of claim 1, wherein the first, second and third terminals are configured to
flow current from the third terminal and to each of the first and second terminals in response to a voltage at the third terminal being higher than a voltage a the first and second terminals, and
flow current from each of the first and second terminals to the third terminal in response to a voltage at the third terminal being lower than a voltage a the first and second terminals.

16. A field-effect magnetic sensor comprising:
first, second and third source/drain terminals in a semiconductor substrate;
for each of the first and second source/drain terminals, a channel region configured and arranged to, in an unbiased state, inhibit current flow between the each of the first and second source/drain terminals and the third source/drain terminal;
a drift region in the substrate and separating the respective channel regions;
a gate configured and arranged to bias the channel regions to create, in the respective channel regions, an inversion layer that flows current between the third source/drain terminal and respective first or second source/drain terminals, via the drift region;
the sensor being configured and arranged to respond to a magnetic field to, when the channel region is in a biased state, pass a greater amount of current between the third source/drain terminal and one of the first and second source/drain terminals, relative to an amount of current passed between the third source/drain terminal and the other one of the first and second source/drain terminals, and an output circuit connected to the first and second source/ drain terminals and configured to, in the absence of a magnetic field, output a differential value from the first and second source/drain terminals that is about zero, and in the presence of a magnetic field, output a non-zero differential value from the first and second source/drain terminals.

17. A magnetic sensor comprising:

two n+ terminals, each terminal including an n+ doped region in a semiconductor substrate;

an n-well electron reservoir terminal in the substrate;

two p-well regions between the n+ terminals and the n-well electron reservoir terminal, each p-well region configured to inhibit current flow between the n-well electron reservoir and the n+ terminals;

for each p-well region, a p+ well contact at an upper surface of the substrate and connected to the p-well region;

a lightly n-doped material in the substrate and extending between the p-well regions;

a gate oxide on the substrate and over the lightly n-doped material and an upper channel region of each of the p-well regions; and a gate electrode over the gate oxide and the channel regions, the gate electrode being configured to control the charge density at the channel regions in response to a voltage applied to the gate electrode, to create an inversion layer in the channel regions to flow current between the n-well electron reservoir terminal and the n+ terminals, through a portion of the lightly n-doped material between the channel regions.

18. A method comprising:

operating a field-effect magnetic sensor having first, second and third source/drain terminals in a semiconductor substrate by, in an on state, biasing channel regions immediately adjacent the first and second source/drain regions, to create an inversion layer in the channel regions and pass current between each of the first and second source/drain regions and a drift region between the channel regions, and between the drift region and the third source/drain terminal, the current flow being responsive to a magnetic field to pass a greater amount of current between the third source/drain terminal and one of the first and second source/drain terminals, relative to an amount of current passed between the third source/drain terminal and the other one of the first and second source/drain terminals; and in an off state, using the channel regions to mitigate current flow between the third source/drain terminal and each of the first and second source/drain regions.

19. The method of claim 18, further including applying a bias to at least one of the terminals to modulate the width of a current path in the drift region to limit the flow of current in the drift region to the current path.

20. The method of claim 18, further including selectively biasing the first and second terminals, relative to the third terminal, to control the direction of current flow between the third terminal and each of the first and second terminals.

21. An apparatus comprising:

means for operating a field-effect magnetic sensor having first, second and third source/drain terminals in a semiconductor substrate using, in an on state, means for biasing channel regions immediately adjacent the first and second source/drain regions, to create an inversion layer in the channel regions and pass current between each of the first and second source/drain regions and a drift region between the channel regions, and between the drift region and the third source/drain terminal, the current flow being responsive to a magnetic field to pass a greater amount of current between the third source/drain terminal and one of the first and second source/drain terminals, relative to an amount of current passed between the third source/drain terminal and the other one of the first and second source/drain terminals; and in an off state, means for the channel regions to mitigate current flow between the third source/drain terminal and each of the first and second source/drain regions.

\* \* \* \* \*